(12) United States Patent
Yang et al.

(10) Patent No.: US 12,119,265 B2
(45) Date of Patent: Oct. 15, 2024

(54) HIGH VOLTAGE DEVICES

(71) Applicant: Taiwan Semiconductor Manufacturing Co., Ltd., Hsin-Chu (TW)

(72) Inventors: Sung-Hsin Yang, Hsinchu (TW); Jung-Chi Jeng, Tainan (TW); Ru-Shang Hsiao, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/942,514

(22) Filed: Jul. 29, 2020

(65) Prior Publication Data
US 2021/0202321 A1 Jul. 1, 2021

Related U.S. Application Data

(60) Provisional application No. 62/955,092, filed on Dec. 30, 2019.

(51) Int. Cl.
*H01L 21/8234* (2006.01)
*H01L 27/088* (2006.01)
*H01L 21/308* (2006.01)

(52) U.S. Cl.
CPC .. *H01L 21/823431* (2013.01); *H01L 27/0886* (2013.01); *H01L 21/3086* (2013.01)

(58) Field of Classification Search
CPC ..... H01L 21/823412; H01L 21/823431; H01L 27/088; H01L 27/0886; H01L 21/3086;
(Continued)

(56) References Cited

U.S. PATENT DOCUMENTS

| | | | |
|---|---|---|---|
| 7,906,802 B2 * | 3/2011 | Baumgartner | H03B 5/1228 257/E21.561 |
| 8,759,904 B2 * | 6/2014 | Wahl | H01L 21/845 257/328 |

(Continued)

FOREIGN PATENT DOCUMENTS

| | | | | |
|---|---|---|---|---|
| CN | 103943681 A | | 7/2014 | |
| CN | 106910686 | * | 6/2017 | ....... H01L 29/66545 |

(Continued)

*Primary Examiner* — Mary A Wilczewski
(74) *Attorney, Agent, or Firm* — HAYNES AND BOONE, LLP

(57) ABSTRACT

Semiconductor devices and methods of forming the same are provided. In an embodiment, a semiconductor device includes a substrate including a core device region and an input/output (I/O) device region, a plurality of core devices in the core device region, each of the plurality of core devices including a first active region extending along a first direction, and a first plurality of input/output (I/O) transistors in the I/O device region, each of the first plurality of I/O transistors including a second active region extending along the first direction. The first active region includes a first width along a second direction perpendicular to the first direction and the second active region includes a second width along the second direction. The second width is greater than the first width.

20 Claims, 18 Drawing Sheets

(58) Field of Classification Search
CPC ............. H01L 27/1207; H01L 27/1211; H01L 21/845; H01L 21/823462; H01L 21/823456
See application file for complete search history.

(56) References Cited

U.S. PATENT DOCUMENTS

| | | | | |
|---|---|---|---|---|
| 8,975,129 | B1* | 3/2015 | Shieh | H01L 21/3086 438/199 |
| 9,034,723 | B1* | 5/2015 | Shieh | H01L 21/31055 438/424 |
| 9,324,570 | B1* | 4/2016 | Liou | H01L 29/6656 |
| 9,431,395 | B2* | 8/2016 | Costrini | H01L 29/6681 |
| 9,431,513 | B2 | 8/2016 | Liu | |
| 9,577,068 | B2* | 2/2017 | Costrini | H01L 29/785 |
| 9,601,567 | B1* | 3/2017 | Hsieh | H01L 21/823431 |
| 9,716,146 | B2 | 7/2017 | Peng | |
| 9,947,764 | B2 | 4/2018 | Liu | |
| 10,121,882 | B1* | 11/2018 | Ho | H01L 21/76802 |
| 10,163,640 | B1* | 12/2018 | Hsieh | H01L 21/823437 |
| 10,164,016 | B2 | 12/2018 | Peng | |
| 10,325,817 | B2* | 6/2019 | Bi | H01L 27/0924 |
| 10,418,460 | B2 | 9/2019 | Liu | |
| 10,692,769 | B2* | 6/2020 | Liang | H01L 29/1037 |
| 10,854,452 | B2* | 12/2020 | Kim | H01L 21/823431 |
| 11,004,747 | B2* | 5/2021 | Liang | H01L 21/823437 |
| 11,056,594 | B2* | 7/2021 | Lin | H01L 29/0649 |
| 2009/0309162 | A1* | 12/2009 | Baumgartner | H01L 29/785 257/E25.01 |
| 2010/0187575 | A1* | 7/2010 | Baumgartner | H01L 29/66818 257/369 |
| 2010/0270621 | A1* | 10/2010 | Iwamoto | H01L 21/823462 257/368 |
| 2012/0146157 | A1* | 6/2012 | Baumgartner | H01L 29/785 257/401 |
| 2013/0049136 | A1* | 2/2013 | Wahl | H01L 27/1211 257/401 |
| 2015/0162437 | A1* | 6/2015 | Oh | H01L 29/0649 257/288 |
| 2015/0249039 | A1* | 9/2015 | Shieh | H01L 21/31055 438/702 |
| 2016/0005735 | A1* | 1/2016 | Costrini | H01L 21/3081 438/283 |
| 2016/0020109 | A1* | 1/2016 | Yoo | H01L 21/306 438/275 |
| 2016/0133632 | A1* | 5/2016 | Park | H01L 29/66545 257/369 |
| 2016/0133703 | A1* | 5/2016 | Chang | H01L 27/1207 257/349 |
| 2017/0125411 | A1* | 5/2017 | Yu | H01L 21/823431 |
| 2017/0345820 | A1* | 11/2017 | Lin | H01L 27/088 |
| 2018/0204836 | A1* | 7/2018 | Lin | H01L 29/7854 |
| 2019/0006392 | A1* | 1/2019 | Liu | H01L 21/823821 |
| 2019/0067112 | A1* | 2/2019 | Liang | H01L 27/0886 |
| 2019/0115263 | A1* | 4/2019 | Bi | H01L 21/823878 |
| 2020/0066907 | A1* | 2/2020 | Jan | H01L 29/66795 |
| 2020/0152461 | A1* | 5/2020 | Kim | H01L 21/823431 |
| 2020/0273754 | A1* | 8/2020 | Liang | H01L 27/0924 |
| 2020/0335620 | A1* | 10/2020 | Lin | H01L 21/823821 |
| 2021/0202321 | A1* | 7/2021 | Yang | H01L 21/823431 |
| 2021/0343596 | A1* | 11/2021 | Yang | H01L 21/823418 |

FOREIGN PATENT DOCUMENTS

| | | |
|---|---|---|
| CN | 107068678 A | 8/2017 |
| TW | 201110350 A | 3/2011 |
| TW | 201347194 A | 11/2013 |
| TW | 201814910 A | 4/2018 |
| TW | 201946111 A | 12/2019 |

* cited by examiner

HIGH VOLTAGE DEVICES

PRIORITY DATA

This application claims priority to U.S. Provisional Patent Application Serial No. 62/955,092 filed on Dec. 30, 2019, the entire disclosure of which is hereby incorporated herein by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

The scaling down of the semiconductor devices also reduces thicknesses of gate dielectric layers, which commands reduced gate voltage to avoid device failure. However, the supply voltage from the external circuitry has not kept up with the pace of scaling down of the semiconductor devices. While the thickness of a gate dielectric layer has been reduced multiple-folds, the supply voltage has only been reduced from about 5 volts to about 3.3 volts. This uneven scaling trend has resulted in ever increasing electric fields in the gate dielectric layer near the drain. The increased electric fields in turn leads to hot carrier injection (HCI, or hot carrier effect (HCE)), which describes a phenomenon where charge carriers (electrons or holes) gain high kinetic energy due to presence to high electric field. HCI is not desirable as it degrades device performance and results in leakages. HCI is especially relevant to input/output (I/O) devices as they interface external circuitry operating at the supply voltage. Conventional techniques, such as increasing channel lengths and increasing gate dielectric thicknesses, have been implemented to alleviate impact brought about by HCI. However, these conventional techniques may not satisfactorily address the device degradation or leakage due to HCI.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
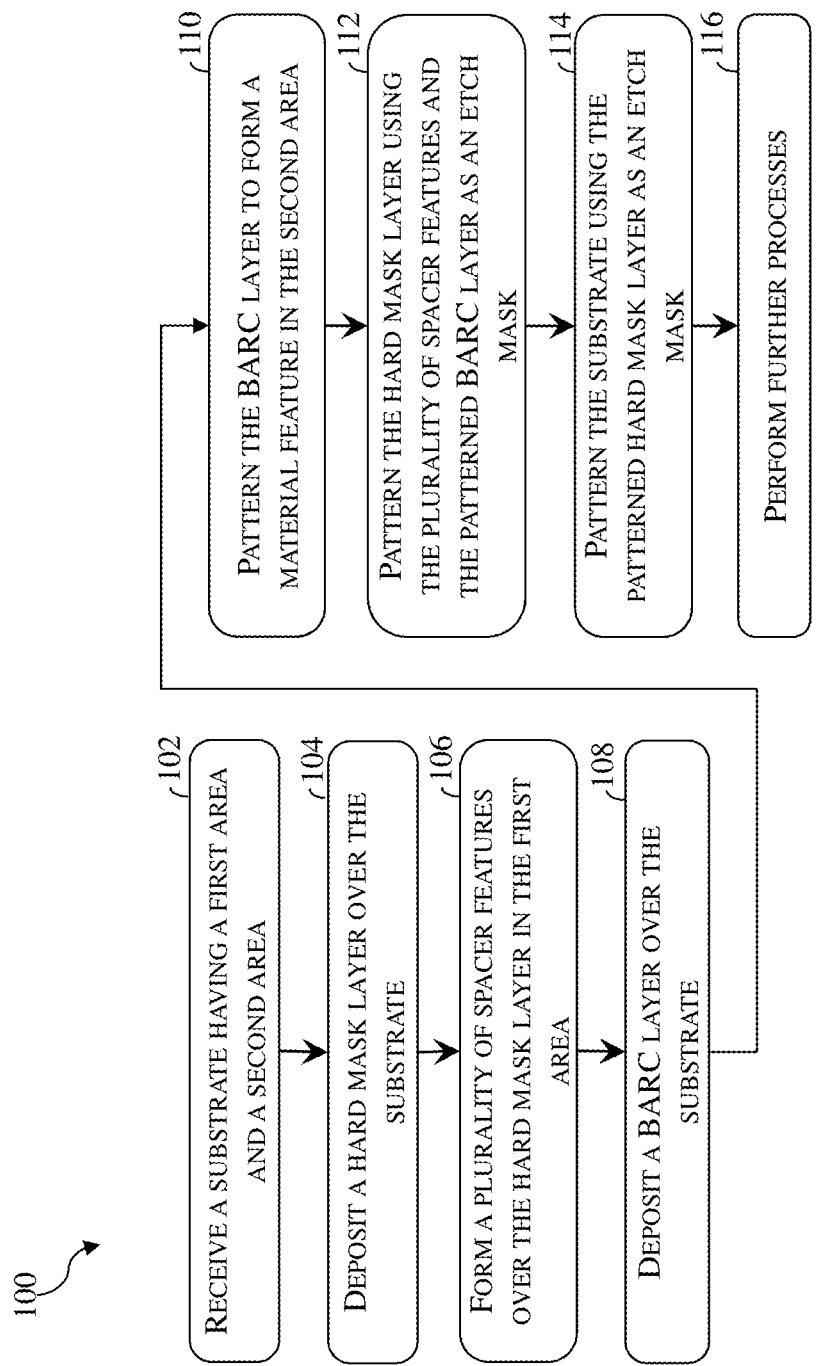
FIG. 1 is a flowchart of a method for fabricating a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is related to a structure for high voltage applications and methods of forming the same. Particularly, the present disclosure is related to input/output (I/O) transistors that interface between core devices in core device regions and external circuits. In some embodiments, I/O transistors according to the present disclosure include semiconductor fins that are wider than the semiconductor fins in core device regions. In some implementations, the wider semiconductor fins may be referred to as a mesa. In some alternative embodiments, I/O transistors according to the present disclosure include a combination of first semiconductor fins that are similar in size to semiconductor fins in core device regions as well as second semiconductor fins that are wider than the first semiconductor fins. The wider semiconductor fins allow I/O transistors of the present disclosure to operate at a voltage equal to or greater than 3.3V. Methods for forming the I/O transistors of the present disclosure are also provided.

The scaling down of semiconductor devices has its fair share of challenges in many aspects. One of the challenges origins from the phenomenon referred to as either hot carrier injection (HCI) or hot carrier effect (HCE). Compared to conventional planar devices, multi-gate devices such as fin field effect transistors (FinFETs) include gate structures that wrap around active regions to provide improved channel control and to combat short channel effect (SCE). The improved channel control of FinFETs may bring about impact ionization due to HCI and increased lateral electric field near the drain, causing damages to gate dielectric layers and device failure. HCI is more prominent when it comes to input/output (I/O) devices where they are operating at a supply voltage from an external circuit, which is much higher than the operating voltage for core devices, such as logic devices or memory devices. Conventionally, lengthened gates and thicker gate dielectric layers have been implemented to I/O FinFET devices to remedy the damages and device failure as a result of HCI. However, while some of these conventional techniques may be effective, they may not yield reliable I/O FinFET devices with good lifetime. Some other conventional techniques involve use of additional circuitry to lower the supply voltage to avoid the HCI at the I/O FinFET devices. However, adding additional circuitry means additional cost and may not always be desirable.

The present disclosure provides methods for forming semiconductor devices that include I/O FinFET devices with good lifetime when operating at supply voltage from external circuits. In some implementations, a hard mask layer is deposited over a substrate having a first area and a second area. Double-patterning or multiple-patterning techniques are then used to form spacer features over the hard mask layer in the first area and photolithography techniques are used to form material features over the hard mask layer in the second area. Each of the material features is wider than each of the spacer features. The material features and the spacer features are then used as an etch mask to pattern the hard mask layer. The patterned hard mask layer is then used to pattern the substrate so as to form first active regions in the first area and second active regions in the second area. The narrower first active regions may be used to form core devices and I/O FinFET devices and the wider second active regions may be used to form I/O FinFET devices suitable for operation at the supply voltage, such as about 3.3 V or more.

The various aspects of the present disclosure will now be described in more detail with reference to the figures. FIG. 1 is a flowchart of a method 100 for fabricating a semiconductor device according to various aspects of the present disclosure. In some implementations, the semiconductor device includes multi-gate transistors where a gate structure wraps around multiple sides of an active region in its channel region. Examples of multi-gate transistors include FinFETs. Method 100 is merely an example and is not intended to limit the present disclosure to what is explicitly illustrated in method 100. Additional steps can be provided before, during, and after method 100, and some of the steps described can be moved, replaced, or eliminated for additional embodiments of method 100. Not all steps are described herein in detail for reasons of simplicity. Method 100 will be described below in conjunction with the fragmentary cross-sectional views of a workpiece 200 shown in FIGS. 2-16. Because a semiconductor device will be formed from the workpiece 200, the workpiece 200 may be referred to as semiconductor device 200 as the context requires.

The semiconductor device 200 may be included in a microprocessor, a memory, and/or other integrated circuit (IC) device. In some implementations, the semiconductor device 200 may be a portion of an IC chip, a system on chip (SoC), or portion thereof, that includes various passive and active microelectronic devices such as resistors, capacitors, inductors, diodes, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. Illustrations of the semiconductor device 200 in FIGS. 2-16 have been simplified for the sake of clarity to better understand the inventive concepts of the present disclosure. Additional features can be added in semiconductor device 200, and some of the features described below can be replaced, modified, or eliminated in other embodiments of semiconductor device 200.

Figure 2:
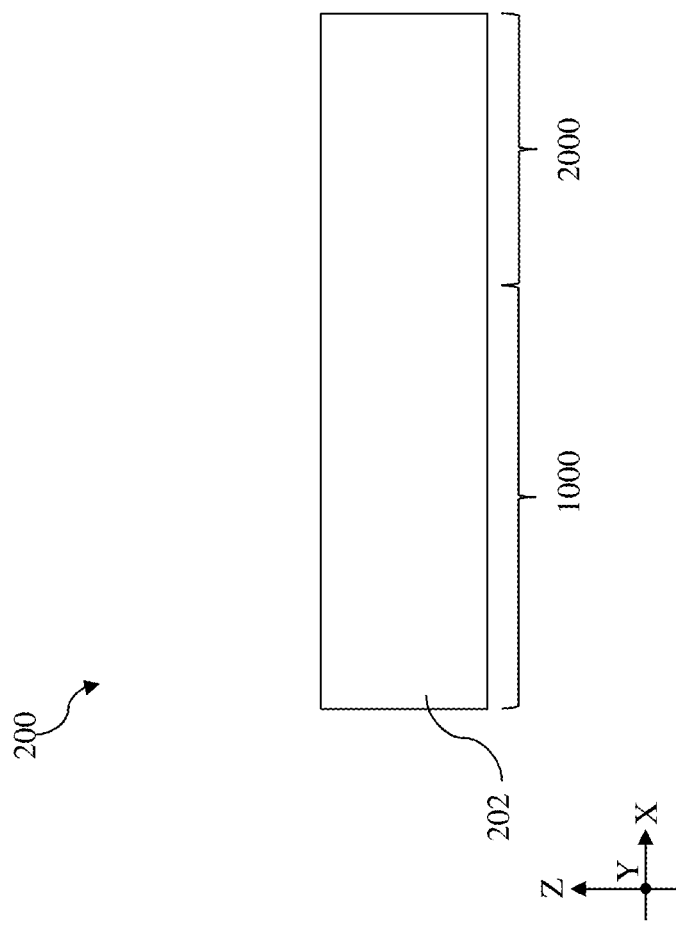
FIGS. 2 through 16 are fragmentary schematic cross-sectional views of a workpiece at various fabrication stages, such as those associated with the method in FIG. 1, according to various aspects of the present disclosure.

Referring to FIGS. 1 and 2, method 100 includes a block 102 where a workpiece 200 that includes a substrate 202 is received. For avoidance of doubts, workpiece 200 is used herein to refer to the workpiece that undergoes method 100. This is so even when FIG. 2 only illustrate substrate 202, on which more layers and features will be formed in subsequent operations. The substrate 202 has a first area 1000 and a second area 2000. In the depicted embodiment, substrate 202 is a bulk substrate that includes silicon. Alternatively, in some implementations, substrate 202 includes a bulk substrate (including, for example, silicon) and one or more material layers disposed over the bulk substrate. For example, the one or more material layers can include a semiconductor layer stack having various semiconductor layers (such as a heterostructure) disposed over the bulk substrate, where the semiconductor layer stack is subsequently patterned to form fins. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design requirements of the semiconductor device 200. In some implementations, the semiconductor layer stack includes alternating semiconductor layers, such as semiconductor layers composed of a first material and semiconductor layers composed of a second material. For example, the semiconductor layer stack alternates silicon layers and silicon germanium layers (for example, Si/SiGe/Si from bottom to top). In some implementations, the semiconductor layer stack includes semiconductor layers of the same material but with alternating constituent atomic percentages, such as semiconductor layers having a constituent of a first atomic percent and semiconductor layers having the constituent of a second atomic percent. For example, the semiconductor layer stack includes silicon germanium layers having alternating silicon and/or germanium atomic percentages (for example, $Si_aGe_b/Si_cGe_d/Si_aGe_b$ from bottom to top, where a, c are different atomic percentages of silicon and b, d are different atomic percentages of germanium). Alternatively or additionally, the bulk substrate 202 and/or the one or more material layers include another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlInAs, AlGaAs, GaInAs, GaInP, and/or GaInAsP; other group III-V materials; other group II-V materials; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

In some embodiments, the first area 1000 is a core device area, over which logic devices and memory devices may be formed while the second area 2000 is an input/output (I/O) area, over which I/O devices may be formed. In some alternative embodiments, the first area 1000 is a hybrid area that includes logic devices, memory devices as well as I/O devices while the second area 2000 includes only I/O devices.

Figure 3:
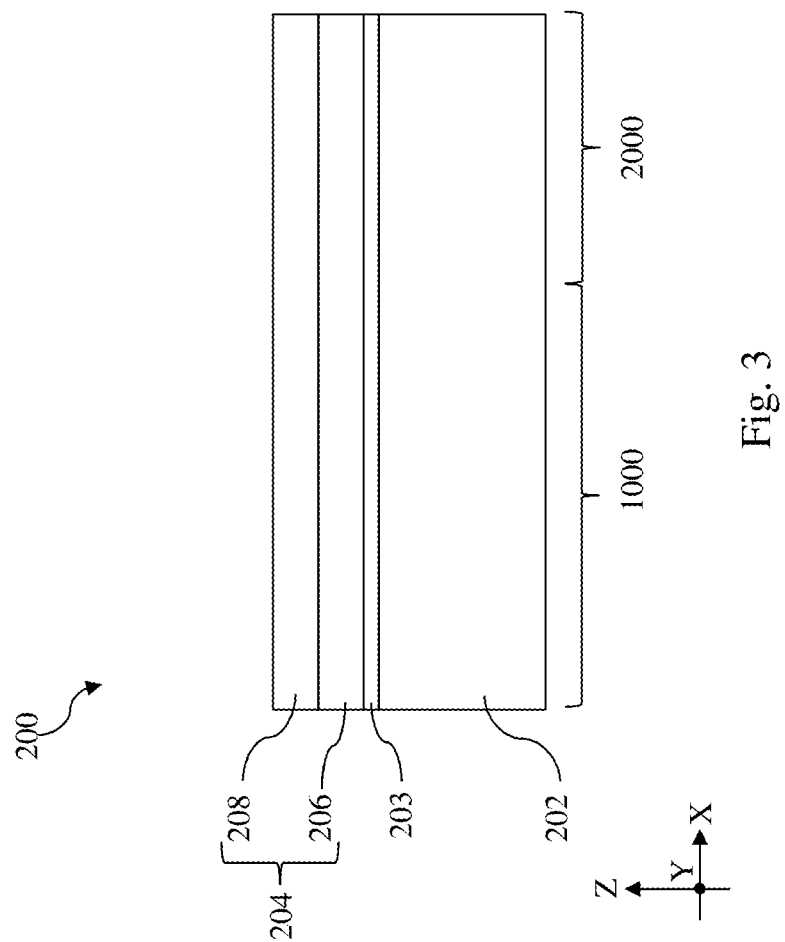

Referring still to FIGS. 1 and 3, method 100 includes a block 104 where a hard mask layer 204 is deposited over the substrate 202. The hard mask layer 204 may be a single layer or a multi-layer. In some embodiments represented in FIG. 3, the hard mask layer 204 is a multi-layer that includes a first layer 206 and a second layer 208 over the first layer 206. In some implementations, the first layer 206 may be formed of silicon nitride, silicon oxynitride, silicon carbonitride, or other suitable dielectric material and the second layer 208 may be formed of silicon oxide or other suitable dielectric material. To provide control over an etch process through the hard mask layer 204, materials for the first layer 206 and the second layer 208 are selected such that they have different etching selectivities with respect to the etch process. The first layer 206 may have a thickness between about 200 Å and about 500 Å and the second layer 208 may have a thickness between about 300 Å and about 700 Å. In one embodiment, the first layer 206 is formed of silicon nitride and has a thickness between about 300 Å and about 400 Å while the second layer 208 is formed of silicon oxide and has a thickness between about 450 Å and about 550 Å. In some embodiments, the hard mask layer 204 may be deposited using chemical vapor deposition (CVD), atomic layer deposition (ALD), or other suitable deposition technique. In some implementations shown in FIG. 3, a pad oxide layer 203 may be formed over the substrate 202 before the deposition of the hard mask layer 204 to improve adhesion of the hard mask layer 204. The pad oxide layer 203 may be formed by thermal oxidation, ALD, CVD, or a suitable method. In some instances, the pad oxide layer 203 has a thickness between about 30 Å and about 50 Å.

Referring to FIGS. 1 and 4-7, method 100 includes a block 106 where a plurality of spacer features 212 are formed over the hard mask layer 204 in the first area 1000. According to the present disclosure, the plurality of spacer features 212 may be transient features formed in a multiple-patterning process, such as a double patterning lithography (DPL) process (for example, a lithography-etch-lithography-etch (LELE) process, a self-aligned double patterning (SADP) process, a spacer-is-dielectric patterning (SIDP) process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. Generally, multiple patterning processes combine lithography processes and self-aligned processes, allowing patterns to be created that have, for example, pitches smaller than what is otherwise obtainable using a single, direct lithography process.

Figure 4:
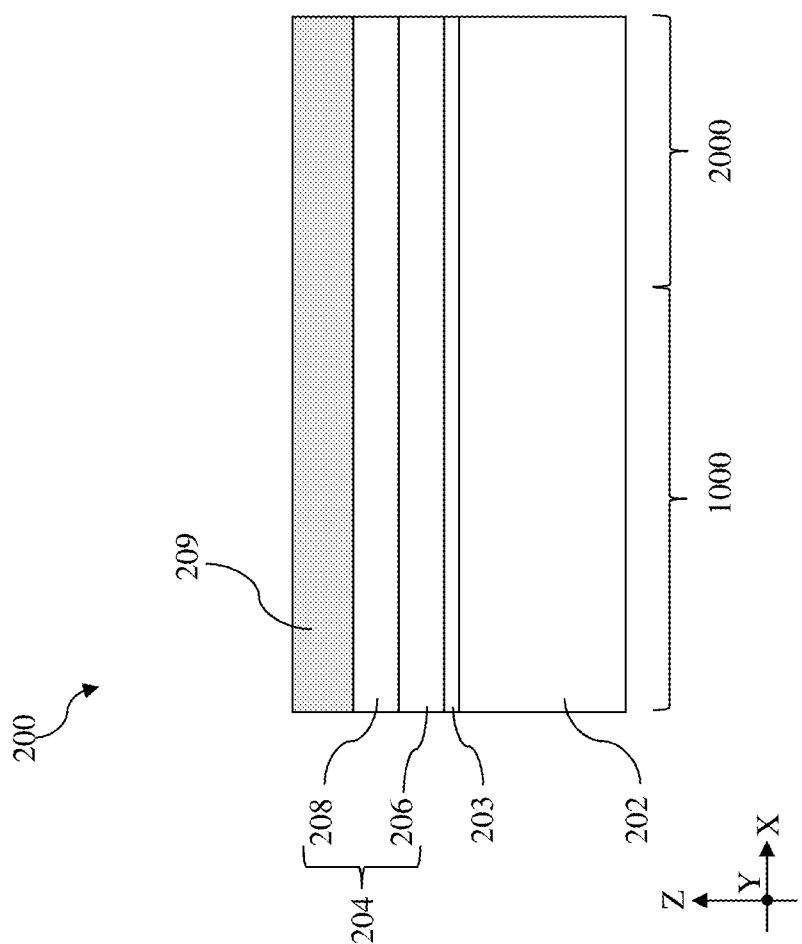
Figure 5:
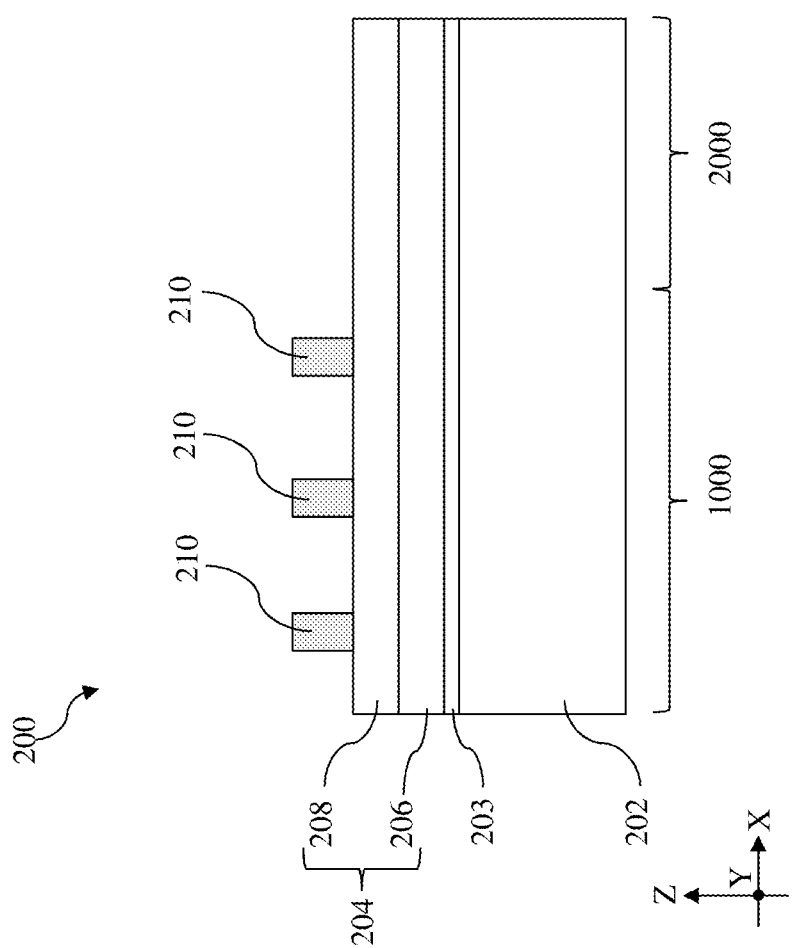

A non-limiting example for forming the plurality of spacer features 212 is representatively shown in FIGS. 4-7. Referring first to FIG. 4, a sacrificial layer 209 is deposited over the hard mask layer 204. In one embodiment, the sacrificial layer 209 may be a silicon nitride or a polysilicon layer deposited using CVD, low pressure CVD (LPCVD), ALD, or a suitable method and may be formed to a thickness between about 1000 Å and about 1400 Å, such as between 1100 Å and about 1300 Å. Then, the sacrificial layer 209 is patterned using a photolithography process to form mandrel features 210 shown in FIG. 5. A photoresist layer (not shown) is deposited over the sacrificial layer 209 using spin-on coating and then the photoresist layer is baked in a pre-exposure baking process. The photoresist layer may be a single layer or a multi-layer, such as a tri-layer. The pre-baked photoresist layer is then exposed to a radiation reflected from or transmitting through a photomask with a pattern. The exposed photoresist layer is then baked in a post-exposure baking process and developed in a developing process. The radiation source may be an excimer laser light source, an ultraviolet (UV) source, a deep UV (DUV) source, or an extreme UV (EUV) source. Because the photoresist layer is selected to be sensitive to the radiation, exposed (or non-exposed) portions of the photoresist layer undergo chemical changes to become soluble in a developer solution during the developing process. The resultant patterned photoresist layer carries a pattern that corresponds to that of the mask. The patterned photoresist layer can then be used as an etch mask during an etching process to remove portions of the underlying sacrificial layer 209. The etching process can include a dry etching process (for example, a reactive ion etching (RIE) process), a wet etching process, other suitable etching process, or combinations thereof. After the etching process, the patterned photoresist layer can be removed by ashing or a suitable method. Alternatively, the exposure process can implement maskless lithography, electron-beam writing, ion-beam writing and/or nanoprint technology. After the patterned photoresist layer is removed, mandrel features 210 shown in FIG. 5 are formed over the hard mask layer 204 in the first area 1000.

Figure 6:
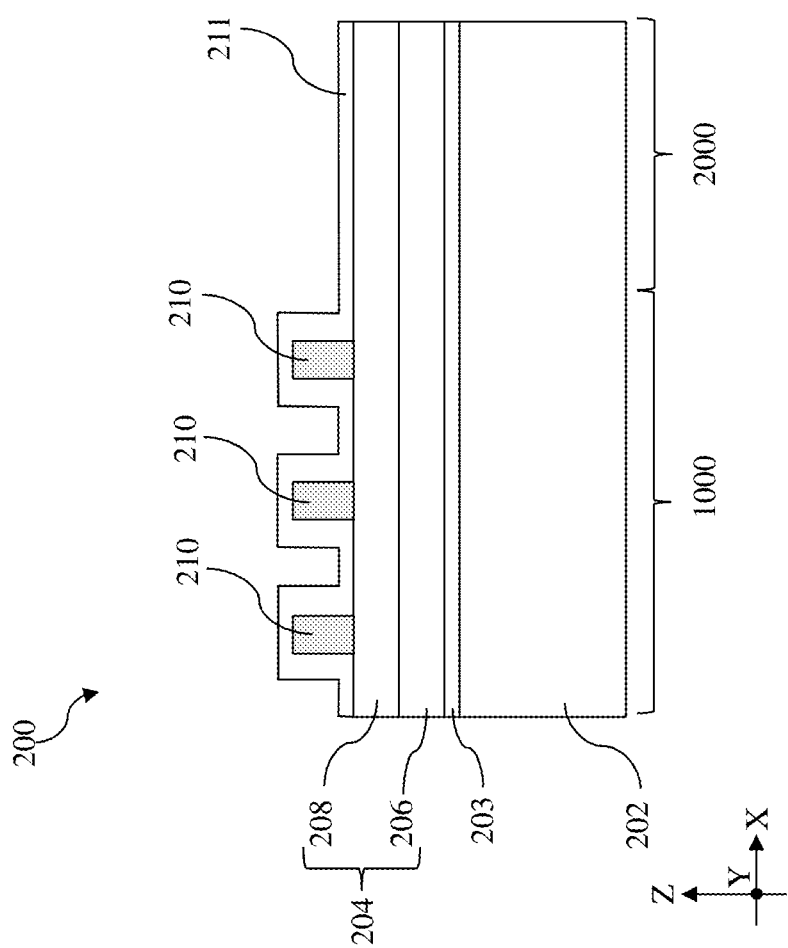
Figure 7:
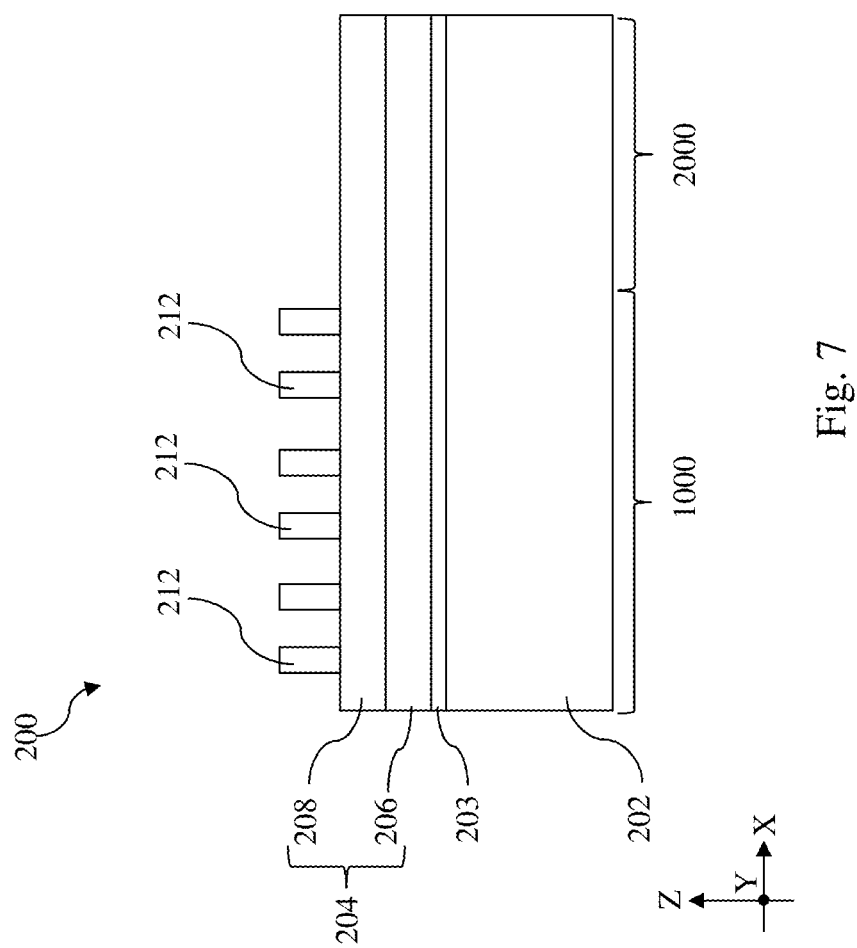

Referring now to FIG. 6, a spacer layer 211 is then blanketly deposited over the workpiece 200, including over the mandrel features 210 in the first area 1000. As shown in the FIG. 6, the spacer layer 211 is deposited along top surfaces and sidewalls of the mandrel features 210. In some embodiments, the spacer layer 211 may be formed of a material that has an etching selectivity different from that of the mandrel features 210 such that the mandrel features 210 may be selectively removed at a subsequent process. For example, the spacer layer 211 may be formed of silicon nitride, silicon oxynitride, silicon carbonitride, silicon carbide, or other suitable materials. The spacer layer 211 is then etched back to expose top surfaces of the mandrel features 210. In some implementations, the etch back of the spacer layer 211 leaves behind vertical portions of the spacer layer 211 that extend along sidewalls of the mandrel features 210 while horizontal portions of the spacer layer 211 that cover the top surface of the hard mask layer 204 is removed. As shown in FIG. 7, the exposure of the mandrel features 210 allows the mandrel features 210 to be selectively removed, thereby forming the plurality of spacer features 212 over the hard mask layer 204 in the first area 1000.

Figure 8:
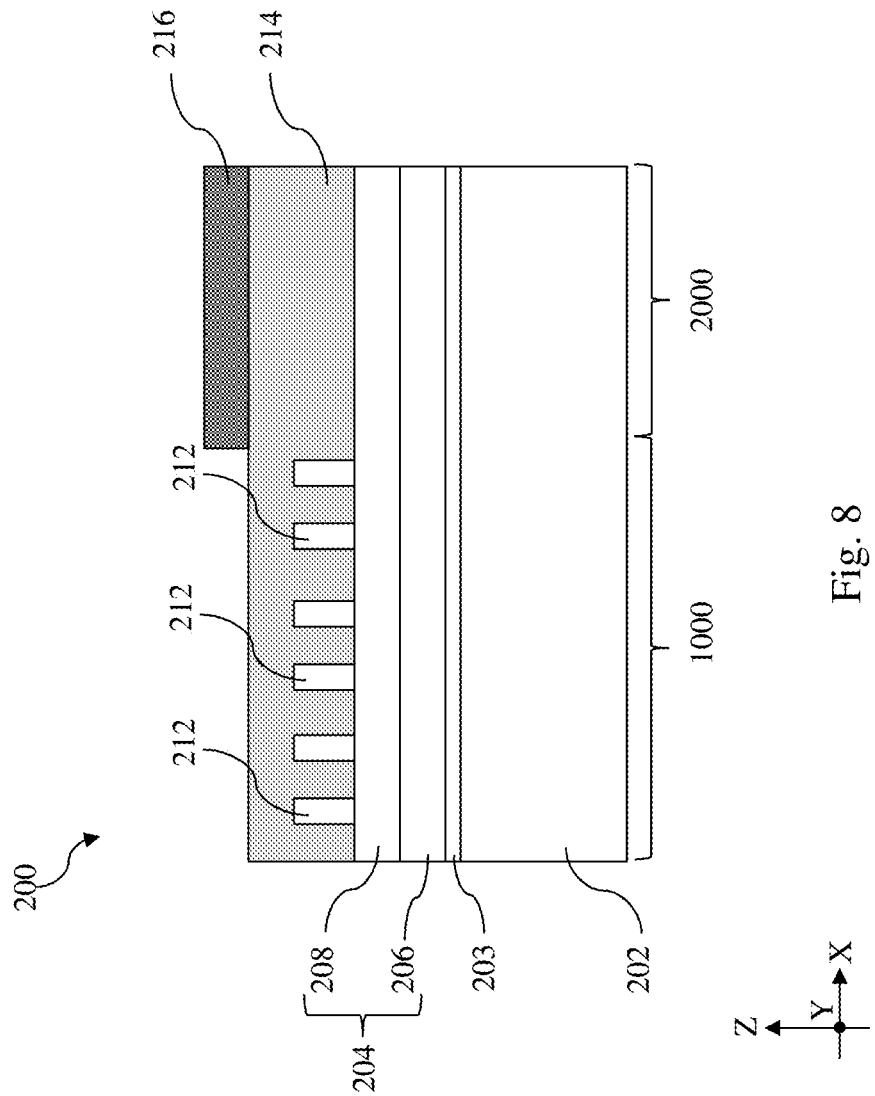

Referring to FIGS. 1 and 8, method 100 includes a block 108 where a bottom antireflective coating (BARC) layer 214 is blanketly deposited over the substrate 202. In some embodiments, the BARC layer 214 may include silicon oxynitride, a polymer, or a suitable material. The BARC layer 214 may be deposited using spin-on coating, CVD, or other suitable method.

Figure 9:
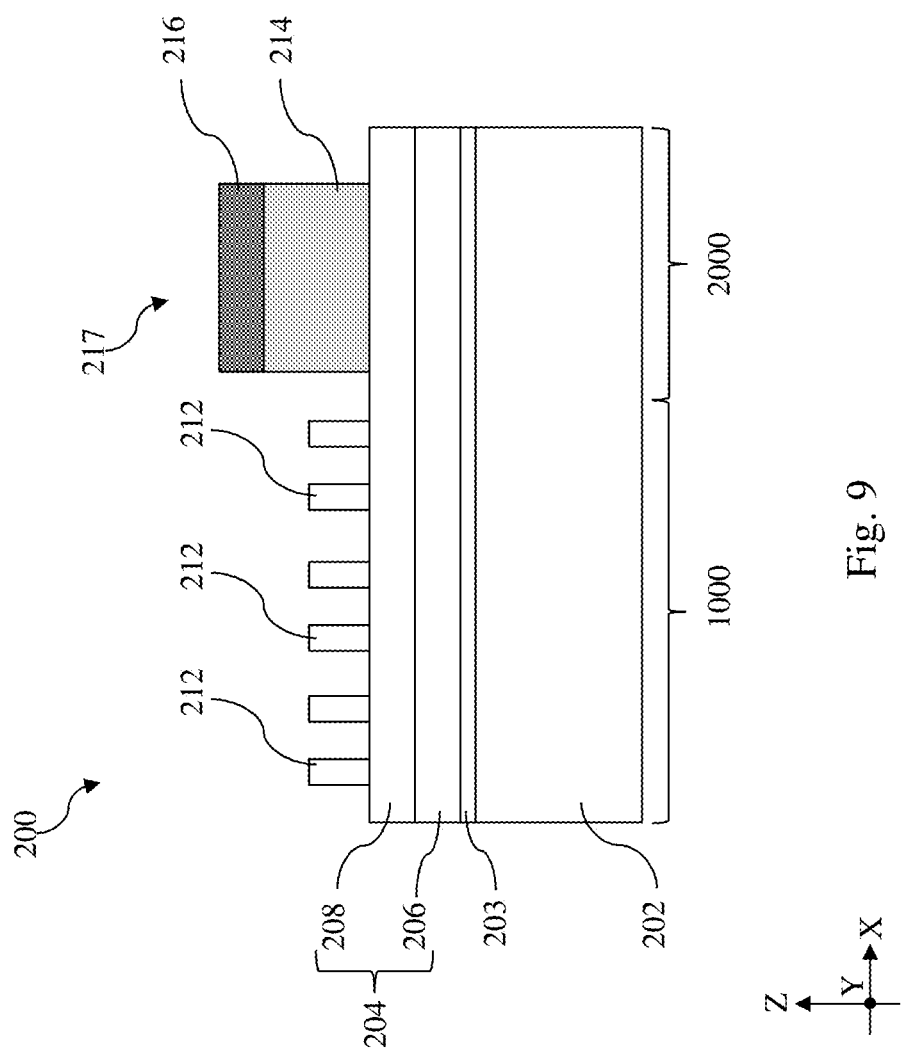

Referring to FIGS. 1, 8 and 9, method 100 includes a block 110 where the BARC layer 214 is patterned to form a material feature 217 in the second area 2000. To pattern the BARC layer 214, a photoresist layer may be deposited over the BARC layer 214 using spin-on coating and then the photoresist layer is baked in a pre-exposure baking process. The photoresist layer may be a single layer or a multi-layer, such as a tri-layer. The pre-baked photoresist layer is then exposed to a radiation reflected from or transmitting through a photomask with a pattern. The exposed photoresist layer is then baked in a post-exposure baking process and developed in a developing process. The radiation source may be an excimer laser light source, an ultraviolet (UV) source, a deep UV (DUV) source, or an extreme UV (EUV) source. Because the photoresist layer is selected to be sensitive to the radiation, exposed (or non-exposed) portions of the photoresist layer undergo chemical changes to become soluble in a developer solution during the developing process. The resultant patterned photoresist layer 216, as illustrated in FIG. 8, carries a pattern that corresponds to that of the mask. The patterned photoresist layer 216 can then be used as an etch mask during an etching process to remove portions of the underlying BARC layer 214 to form the material feature 217 over the hard mask layer 204 in the second area 2000, as shown in FIG. 9. The etching process can include a dry etching process (for example, a reactive ion etching (RIE) process), a wet etching process, other suitable etching process, or combinations thereof.

Figure 10:
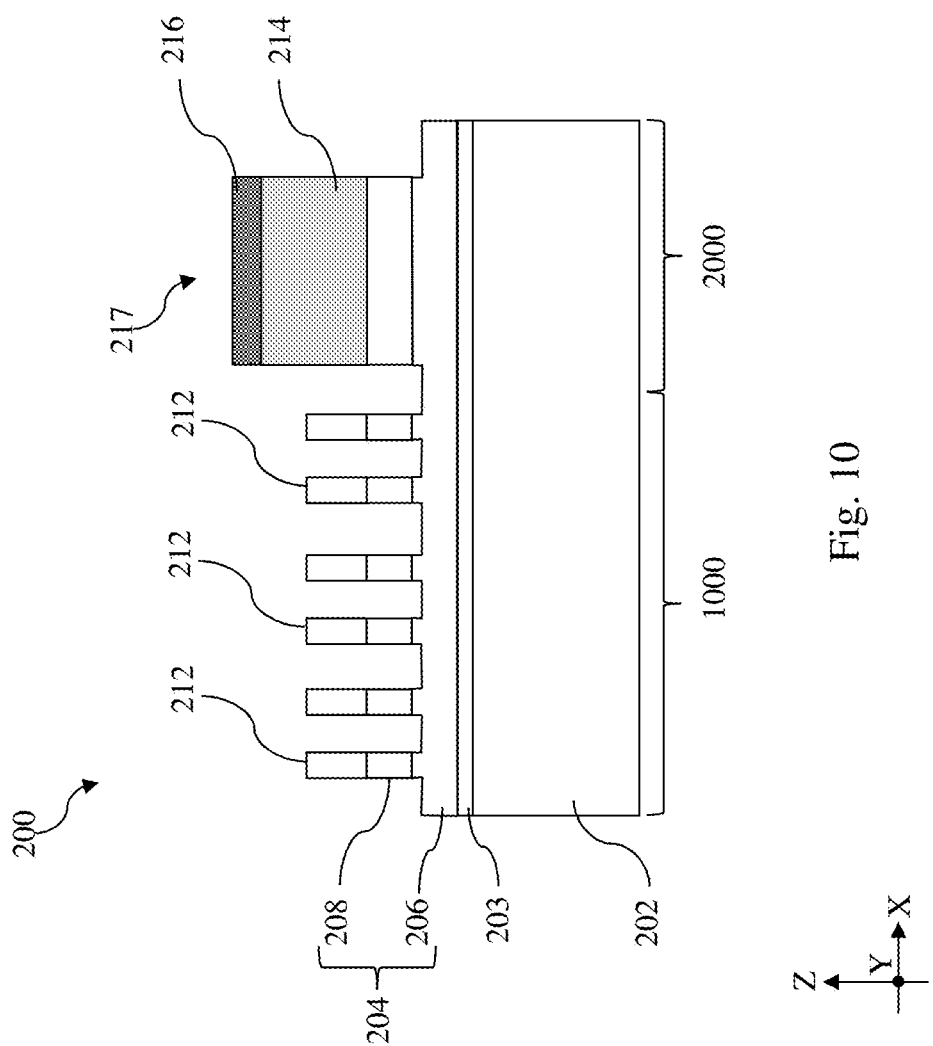
Figure 11:
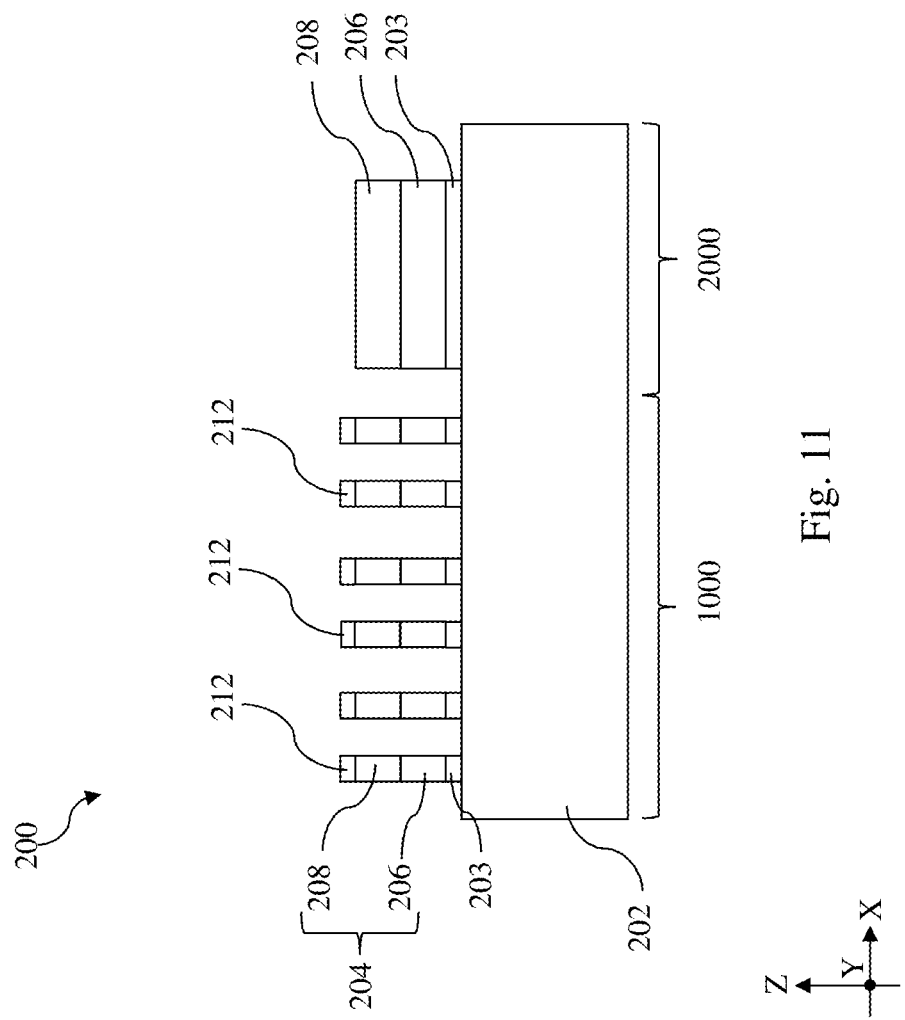

Referring to FIGS. 1, 10 and 11, method 100 includes a block 112 where the hard mask layer 204 is patterned using the plurality of spacer features 212 and the patterned BARC layer 214 as an etch mask. In some embodiments, operations at block 112 may include more than one etching operations. In an example, the second layer 208 in FIG. 10 is first etched using the plurality of spacer features 212 and the patterned BARC layer 214 as an etch mask in a first etching process that is suitable for etching the second layer 208. Then, as shown in FIG. 11, the first layer 206 is etched using the plurality of spacer features 212 and the patterned BARC layer 214 as an etch mask in a subsequent second etching process that is suitable for etching the first layer 206. Finally, a third etching process may be performed to etch through the pad oxide layer 203 to expose the underlying substrate 202. In some implementations represented in FIG. 11, because the plurality of spacer features 212 and the first layer 206 may be formed of substantially similar material, the second etching process may simultaneously etch both the plurality of spacer features 212 and the first layer 206. In FIG. 11, a thickness of each of the plurality of spacer features 212 may be reduced while the second etching process etches through the first layer 206. The third etching process that follows the second etching process may then be performed to etch through the pad oxide layer 203. In some instances, the first etching process and the third etching process may include similar chemistry. Upon conclusion of operations at block 112, the hard mask layer 204 is patterned to have, in the first area 1000, mask features corresponding to the plurality of spacer features 212 and, in the second area 2000, a mask feature corresponding to the patterned BARC layer 214.

Figure 12:
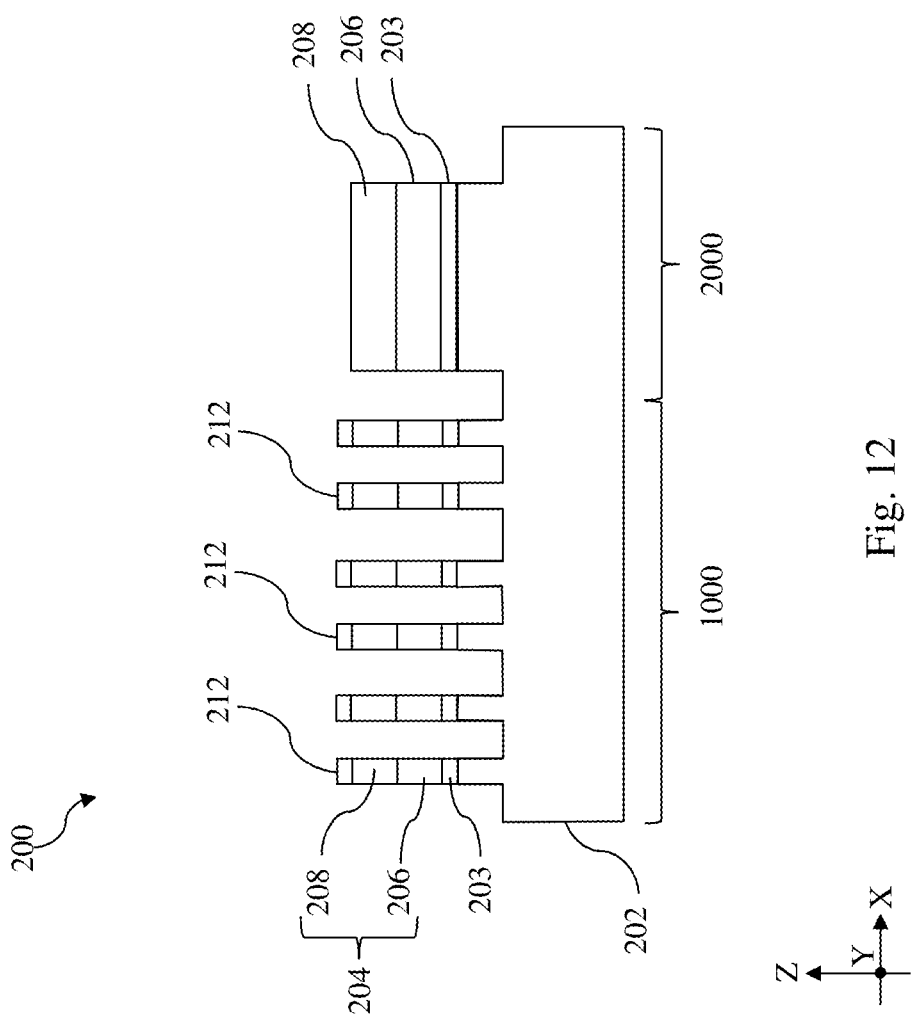
Figure 13:
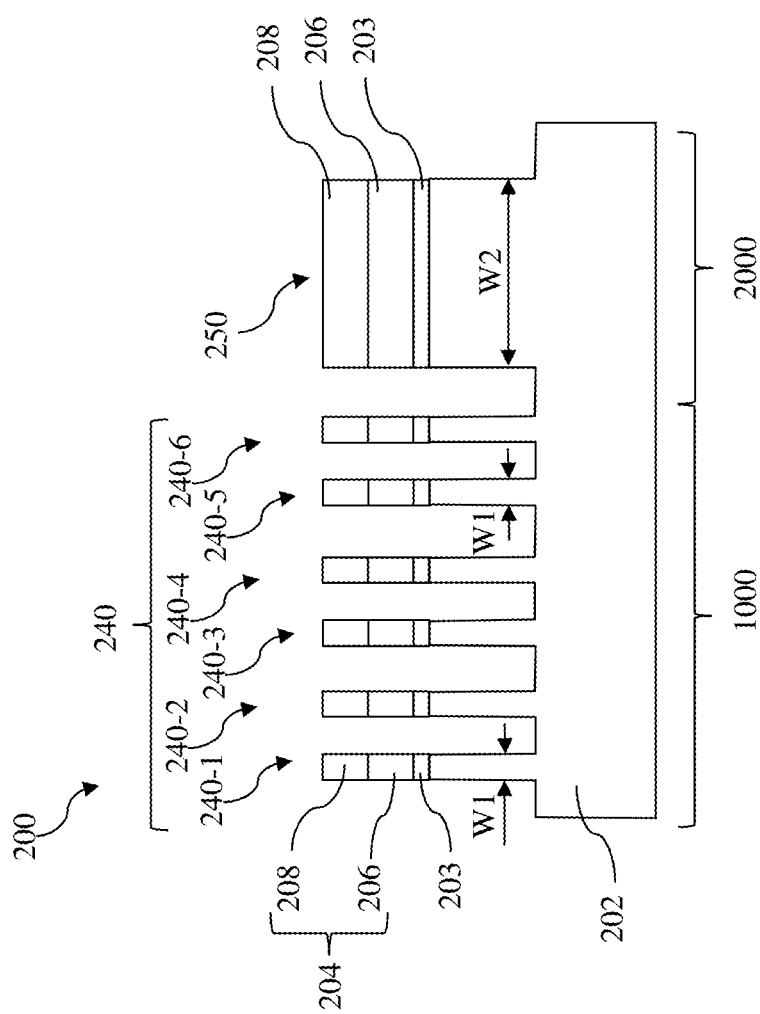

Referring to FIGS. 1, 12 and 13, method 100 includes a block 114 where the substrate 202 is patterned using the patterned hard mask layer 204 as an etch mask. In some embodiments, the substrate 202 may be anisotropically etched through the patterned hard mask layer 204. As the etching process progresses downward into the substrate 202, the plurality of spacer features 212 over the patterned hard mask layer 204 may be removed, as shown in FIG. 13. The patterning of the hard mask layer 204 at block 114 include first fins 240 (or first semiconductor fins 240) in the first area 1000 and second fins 250 (or second semiconductor fins 250) in the second area 2000. While not shown in the fragmentary cross-sectional views in FIG. 13, each of the first fins 240 and the second fins 250 extend lengthwise along the Y direction. In some implementations, each of first fins 240 includes a first width W1 along the X direction and each of the second fins 250 include a second width W2 along the X direction. The second width W2 is greater than the first width W1. In some implementations, a ratio of the second width W2 over the first width W1 (W2/W1) is between about 2 and about 600. That is, the second width W2 is at least twice of the first width W1. In one example, the first width W1 is between about 5 nm and about 10 nm and the second width W2 is between about 20 nm and about 6000 nm. Because the first fins 240 and the second fins 250 serve as the semiconductor body of devices on the semiconductor device 200, the first fins 240 may be referred to as first active regions 240 and the second fins 250 may be similarly referred to as the second active regions 250. Due to their wider width along the X direction than the first fins 240, the second fins 250 may also be referred to as mesas 250.

Figure 14:
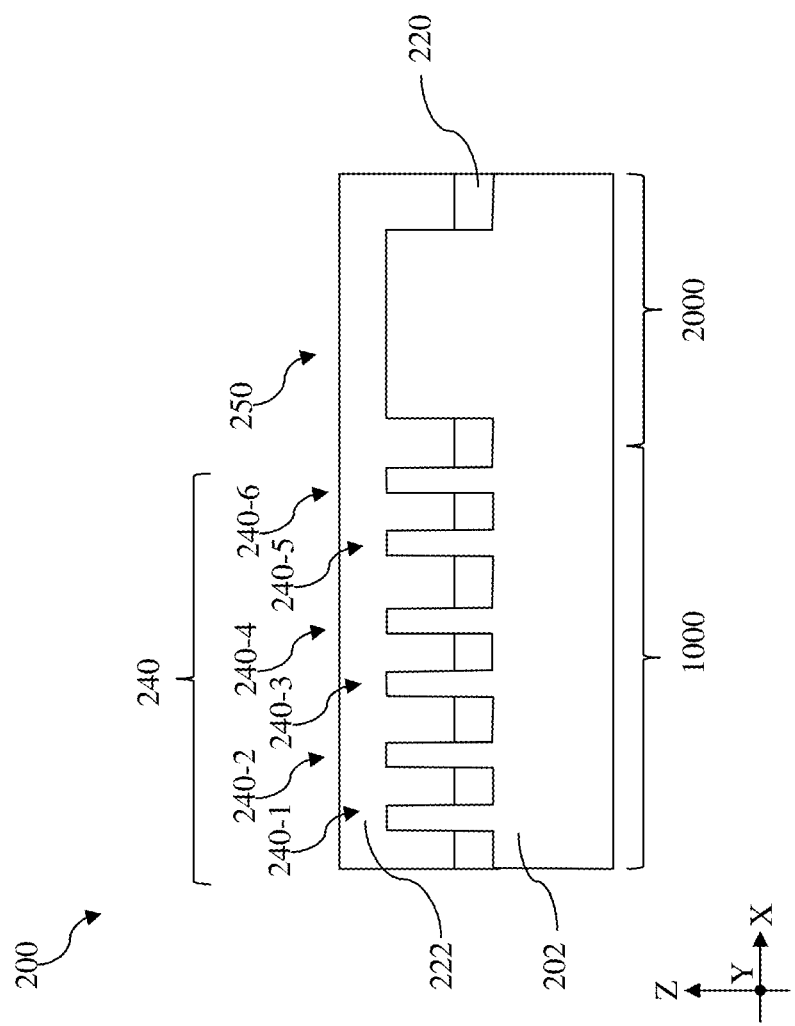

Referring to FIGS. 1, 14, 15, and 16, method 100 includes a block 116 where further processes are performed. Such further processes may include formation of isolation structures 220 along first and second fins 240 and 250, formation of a dummy gate dielectric layer over the first fins 240 and the second fins 250, formation of a dummy gate stack over channel regions of the first fins 240 and the second fins 250, formation of one or more gate spacer layers over sidewalls of the dummy gate stack, deposition of an interlayer dielectric (ILD) layer over the workpiece, formation of source/drain recesses in source/drain regions, formation of source/drain features in source/drain recesses, removal of the dummy gate stack, formation of the first fins 240 and the second fins 250, formation of a gate structure 222 (as shown in FIG. 14) over channel regions of the first fins 240 and the second fins 250 lengthwise along the X direction. In some embodiments, the gate structure 222 may include an interfacial layer, a gate dielectric layer over the interfacial layer, one or more work function layer over the gate dielectric layer, and a metal fill layer over the work function layer. Depending on the design of the semiconductor device 200, the gate structure 222 may be divided into a plurality of gate segments shown in FIGS. 15 and 16.

Figure 15:
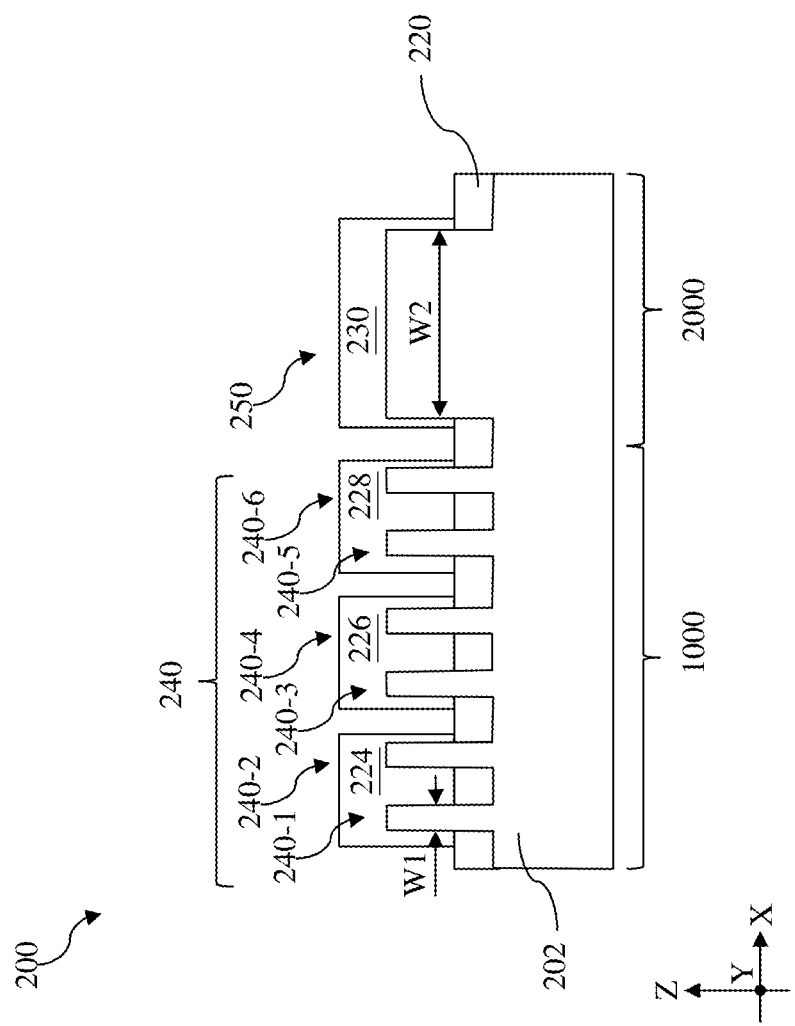

Reference is now made to FIG. 15. In some embodiments, the gate structure 222 shown in FIG. 14 may undergo a metal gate cut process to be divided into a first gate segment 224, a second gate segment 226, a third gate segment 228, and a fourth gate segment 230. As shown in FIG. 15, the first gate segment 224 spans over and wraps around first fins 240-1 and 240-2, the second gate segment 226 spans over and wraps around first fins 240-3 and 240-4, the third gate segment 228 spans over and wraps around first fins 240-5 and 240-6, and the fourth gate segment 230 spans over and wraps around the second fin 250. In these embodiments, each of the first, second and third gate segments 224, 226 and 228 controls a core device in the first area 1000 and the fourth gate segment 230 controls an input/output (I/O) device in the second area 2000. Although only one I/O device in the second area 2000 is shown, the semiconductor device 200 may include multiple similar I/O devices in the second area 2000. In these embodiments shown in FIG. 15, the first area 1000 is a core device area and the second area 2000 is an I/O device area. In some implementations, the core devices in the first area 1000 may have an operating voltage between 0.5 V and about 0.9 V, such as 0.8 V. Thanks to the increased width of the second fins 250 that alleviates HCI, the I/O device in the second area 2000 may operate at an operating voltage between about 2.5 V and about 8 V, such as between about 3.3 V and about 8 V, with good lifetime. Here, good lifetime may be defined as being failure-free in a 10-year simulation cycle. In addition, the I/O device in the second area 2000 serves as the I/O device for the core devices in the first area 1000. It is noted that while double-fin devices are shown in FIG. 15, they are merely examples and the present disclosure fully contemplates other single fin or other multi-fin devices. In addition, although four gate segments are shown, the present disclosure fully contemplates embodiments with more or less gate segments. In some instances, a ratio of the operating voltage of the core devices in the first area 1000 to the operating voltage of the I/O devices in the second area 2000 may be between about 3 and about 10, including between about 4 and about 10.

Figure 16:
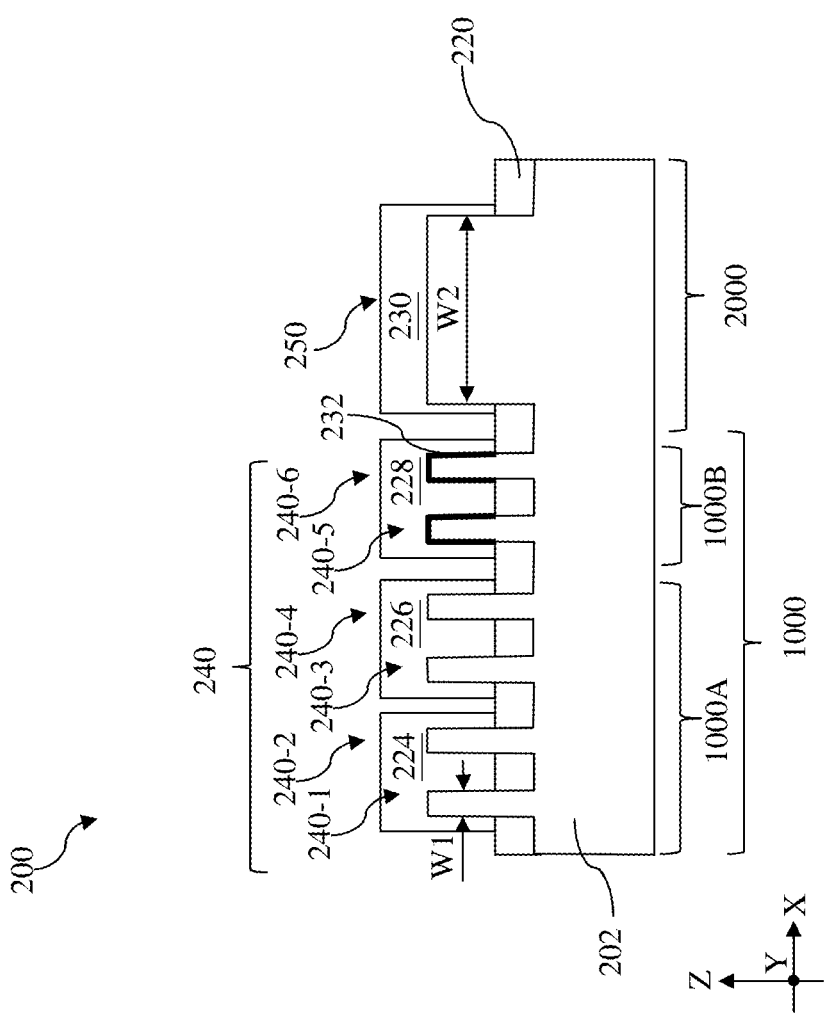

Referring now to FIG. 16, in some alternative embodiments, the first area 1000 may be divided into a first sub-area 1000A and a second sub-area 1000B. Each of the first and second gate segments 224 and 226 controls a core device in the first sub-area 1000A. The third gate segment 228 controls a first I/O device in the second sub-area 1000B. The fourth gate segment 230 controls a second I/O device in the second area 2000. In these alternative embodiments, the dummy gate dielectric layer over second sub-area 1000B is either not removed or not completely removed from the first fins 240-5 and 240-6 while the dummy gate dielectric layer over the first sub-area 1000A and the second area 2000 are completely removed. The non- removal or incomplete removal of the dummy gate dielectric layer in the second sub-area 1000B results in a leftover dummy gate dielectric layer 232 in the second sub-area 1000B, thereby increasing the operating voltage of the first I/O device in the second sub-area 1000B. Because the composition of the leftover dummy gate dielectric layer 232 is similar to the composition of the interfacial layer that is universally formed in the first area 1000 and the second area 2000, the presence of the leftover dummy gate dielectric layer 232 has the effect of increasing the thickness of the interfacial layer in the first I/O device in the second sub-area 1000B.

Referring still to FIG. 16, the semiconductor device 200 according to these alternative embodiments provides two different I/O device area—the second sub-area 1000B and the second area 2000. The first I/O device in the second sub-area 1000B has additional leftover dummy gate dielectric layer 232 (or a thicker interfacial layer, in effect) and the second I/O device in the second area 2000 has wider active region. In some instances, the first I/O device may have an operating voltage between about 1.8 V and about 2.75 V and the second I/O device may have an operating voltage between about 2.5 V and about 8 V, including between about 3.3 V and about 8 V. The semiconductor device 200 according to these alternative embodiments may be compatible with external circuits operating either at the operating voltage of the first I/O device (between about 1.8 V and about 2.75 V) or the operating voltage of the second I/O device (between about 2.5 V and about 8 V, including between about 3.3 V and about 8 V). Due to the formation process representatively illustrated in method 100 in FIG. 1, the second sub-area 1000B is disposed between the first sub-area 1000A and the second area 2000.

Figure 17:
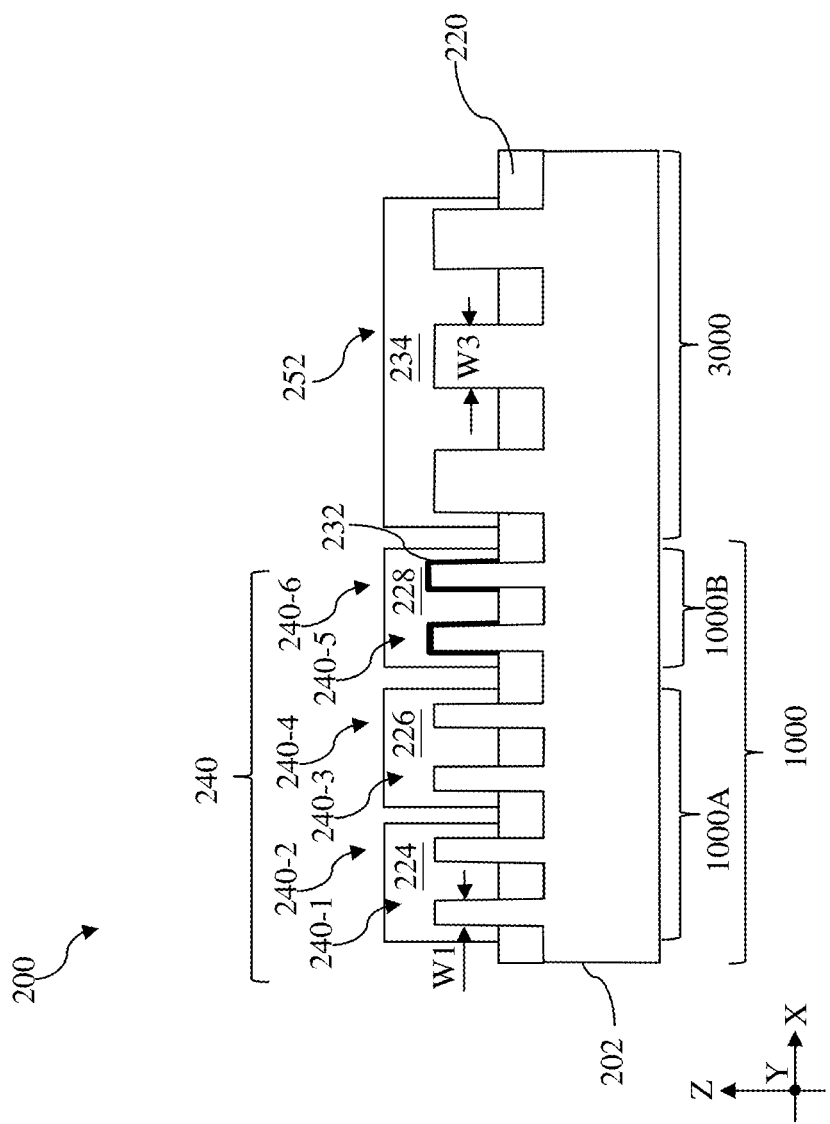
FIGS. 17 and 18 are fragmentary schematic cross-sectional views of semiconductor devices according to various aspects of the present disclosure.
Figure 18:
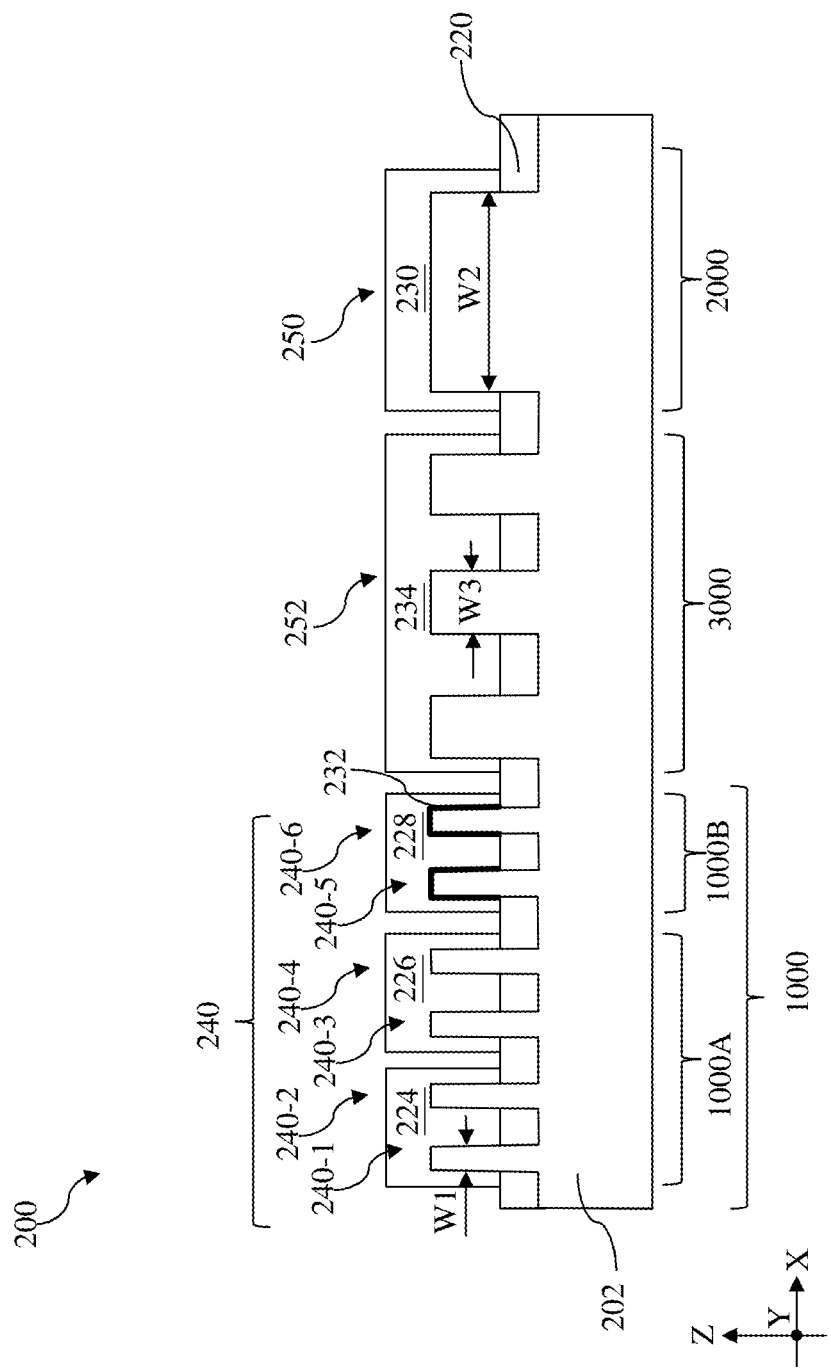

The present disclosure contemplates further embodiments to meet various design needs. Examples of such further embodiments are illustrated in FIGS. 17 and 18. As compared to the semiconductor device 200 shown in FIG. 16, the semiconductor device 200 in FIG. 17 includes a plurality of third fins 252 in the third area 3000 instead of the second fin 250 in the second area 2000. A fifth gate segment 234 is disposed over the plurality of third fins 252 to control an I/O device in the third area 3000. Each of the plurality of third fins 252 has a third width W3, which is greater than the first width W1. A ratio of the third width W3 to the first width W1 may be between about 2 and about 600. In some implementations, the third width W3 of the third fins 252 in FIG. 17 may be smaller than the second width W2 of the second fins 250 shown in FIG. 16. In these implementations, a ratio of the second width W2 to the third width W3 may be between about 2 and about 5. In these implementations, the third fins 252 may be referred to as wide fins or mix fins while the second fins 250 may be referred to as mesas. In some embodiments, the I/O devices in both the second area 2000 and the third area 3000 have an operating voltage between about 2.5 V and about 8 V. In some other embodiments, the operating voltage of the I/O devices in the third area 3000 is smaller than that of the I/O devices in the second area 2000.

The semiconductor device 200 illustrated in FIG. 18 represents a combination of the embodiments shown in FIGS. 16 and 17. The semiconductor device 200 in FIG. 18 includes three areas—the first area 1000, the second area 2000, and the third area 3000. The different types of active regions in the first, second and third areas 1000, 2000 and 3000 have been described above and will not be repeated here. The semiconductor device 200 in FIG. 18 therefore includes three types of I/O devices. The first type of I/O devices are those disposed in the second sub-area 1000B; the second type of I/O devices are those disposed in the second area 2000; and the third type of I/O devices are those disposed in the third area 3000.

Semiconductor devices of the present disclosure provide benefits. An example semiconductor device includes a first area and a second area. The first area includes core devices formed in first fins and the second area includes input/output (I/O) devices formed in second fins. Each of the first fins has a first width W1 and each of the second fins has a second width W2. The second width W2 is greater than the first width W1. In embodiments of the present disclosure, a ratio of the second width W2 to the first width W1 may be between about 2 and about 600. The greater second width W2 reduces HCI and allows I/O FinFETs in the second area to operate at a supply voltage between about 2.5 V and about 8 V with good lifetime. This example semiconductor device is therefore compatible with external circuits with a supply voltage between 2.5 V and 8 V, such as 3.3 V. Other variations are possible. For instance, I/O devices may also be formed in the first fins in the first area such that the semiconductor device may also be compatible with external circuits operating at a different supply voltage.

The present disclosure provides for many different embodiments. In one embodiment, a semiconductor device is provided. The semiconductor device includes a substrate including a core device region and an input/output (I/O) device region, a plurality of core devices in the core device region, each of the plurality of core devices including a first active region extending along a first direction, and a first plurality of input/output (I/O) transistors in the I/O device region. Each of the first plurality of I/O transistors includes a second active region extending along the first direction. The first active region includes a first width along a second direction perpendicular to the first direction and the second active region includes a second width along the second direction. The second width is greater than the first width.

In some embodiments, a ratio of the second width to the first width is between about 2 and about 600. In some implementations, the plurality of core devices operate at a first voltage and the first plurality of I/O transistors operate at a second voltage. A ratio of the second voltage to the first voltage is between about 3 and about 10. In some instances, the first voltage is about 0.8 V and the second voltage is between 2.5 V and about 8 V. In some embodiments, the semiconductor device further includes a first gate structure disposed over the first active region and a second gate structure disposed over the second active region. The first gate structure includes a first interfacial layer disposed on the first active region. The second gate structure includes a second interfacial layer disposed on the second active region. A thickness of the first interfacial layer is substantially similar to a thickness of the second interfacial layer. In some embodiments, the semiconductor device further includes a second plurality of input/output (I/O) transistors. Each of the second plurality of I/O transistors includes a third active region extending along the first direction. The third active region includes a third width along the second direction and the third width is substantially identical to the first width. In some implementations, the semiconductor device further includes a first gate structure disposed over the first active region, a second gate structure disposed over the second active region, and a third gate structure disposed over the third active region. The first gate structure includes a first interfacial layer disposed on the first active region. The second gate structure includes a second interfacial layer disposed on the second active region. The third gate structure includes a third interfacial layer disposed on the third active region. A thickness of the first interfacial layer is substantially similar to a thickness of the second interfacial layer. A thickness of the third interfacial layer is greater than the thickness of the first interfacial layer. In some instances, the plurality of core devices operate at a first voltage, the first plurality of I/O transistors operate at a second voltage, and the second plurality of I/O transistors operate at a third voltage. The second voltage is greater than the third voltage and the third voltage is greater than the first voltage. In some instances, the first voltage is between about 0.5 V and about 0.9 V, the second voltage is between about 2.5 V and about 8 V, and the third voltage is between about 1.8 V and about 2.75 V. In some embodiments, the second plurality of I/O transistors are disposed between the first plurality of I/O transistors and the plurality of core devices.

In another embodiment, a semiconductor device is provided. The semiconductor device includes a substrate, a plurality of core devices each including a first active region extending along a first direction, a first plurality of input/output (I/O) transistors each including a second active region extending along the first direction, and a second plurality of I/O transistors each including a third active region extending along the first direction. The first active region includes a first width along a second direction perpendicular to the first direction, the second active region includes a second width along the second direction, and the third active region includes a third width along the second direction. The first width is equal to the second width and the third width is greater than the first width.

In some embodiments, the first plurality of I/O transistors are disposed between the plurality of core devices and the second plurality of I/O transistors. In some implementations, the semiconductor further includes a first gate structure disposed over the first active region and extending along the second direction, a second gate structure disposed over the second active region and extending along the second direction, and a third gate structure disposed over the third active region and extending along the second direction. The first gate structure includes a first interfacial layer disposed on the first active region and the second gate structure includes a second interfacial layer disposed on the second active region. The third gate structure includes a third interfacial layer disposed on the third active region and a thickness of the first interfacial layer is substantially similar to a thickness of the third interfacial layer. A thickness of the second interfacial layer is greater than the thickness of the first interfacial layer. In some embodiments, the plurality of core devices operate at a first voltage, the first plurality of I/O transistors operate at a second voltage, the second plurality of I/O transistors operate at a third voltage, and the third voltage is greater than the second voltage and the second voltage is greater than the first voltage. In some instances, the first voltage is between about 0.5 V and about 0.9 V, the second voltage is between about 1.8 V and about 2.75 V, and the third voltage is between about 2.5 V and about 8V.

In yet another embodiment, a method is provided. The method includes providing a substrate including a first area and a second area, depositing a hard mask layer over the substrate, selectively forming a plurality of spacer features over the hard mask layer in the first area, selectively forming a material feature over the hard mask layer in the second area, etching the hard mask layer using the plurality of spacer features and the material feature as an etch mask, thereby forming a patterned hard mask layer, and etching the substrate using the patterned hard mask layer as an etch mask. Each of the plurality of spacer features and the material feature extend lengthwise along a first direction. Each of plurality of spacer features has a first width along a second direction perpendicular to the first direction. The material feature has a second width along the second direction. The second width is greater than the first width.

In some embodiments, the first area includes a core device area and the second area includes an input/output (I/O) device area. In some implementations, the selectively forming of the plurality of spacer features includes depositing a sacrificial layer over the hard mask layer, patterning the sacrificial layer to form a plurality of mandrel features, depositing a spacer layer over the mandrel features, etching back the spacer layer to expose top surfaces of the plurality of mandrel features, and selectively removing the plurality of mandrel features. In some implementations, the forming of the material feature includes depositing a bottom antireflective coating (BARC) layer over the plurality of spacer features and the hard mask layer and patterning the BARC layer to forming the material feature. In some embodiments, a ratio of the second width to the first width is between about 2 and about 600.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
  a substrate including a core device region and an input/output (I/O) device region;
  a plurality of core devices in the core device region, each of the plurality of core devices including a first active region and the first active region including two semiconductor fins extending in parallel along a first direction and spaced apart along a second direction perpendicular to the first direction;

a first plurality of input/output (I/O) transistors in the I/O device region, each of the first plurality of I/O transistors including a second active region extending along the first direction;

a first gate structure wrapping around the two semiconductor fins in the first active region and extending lengthwise along the second direction;

a second gate structure wrapping around the second active region and extending lengthwise along the second direction; and a second plurality of input/output (I/O) transistors, each of the second plurality of I/O transistors including a third active region extending along the first direction, wherein each of the two semiconductor fins in the first active region includes a first width along the second direction and the second active region includes a second width along the second direction, wherein the second width is greater than the first width, wherein the first gate structure comprises a first gate dimension along the first direction, wherein the second gate structure comprises a second gate dimension along the first direction, wherein the first gate dimension and the second gate dimension are the same and the first gate structure and the second gate structure are aligned and spaced apart from one another along the second direction to give appearance that the first gate structure and the second gate structure are divided from a single gate structure extending along the second direction, wherein the third active region includes a third width along the second direction, wherein the third width is substantially identical to the first width.

2. The semiconductor device of claim 1, wherein a ratio of the second width to the first width is between about 2 and about 600.

3. The semiconductor device of claim 1,
wherein the first active region and the second active region extend continuously from the substrate,
wherein the plurality of core devices operate at a first voltage,
wherein the first plurality of I/O transistors operate at a second voltage,
wherein a ratio of the second voltage to the first voltage is between about 3 and about 10.

4. The semiconductor device of claim 3,
wherein a height of the first active region measured from a top surface of the substrate is substantially identical to a height of the second active region measured from the top surface of the substrate,
wherein the first voltage is about 0.8 V and the second voltage is between 2.5 V and about 8 V.

5. The semiconductor device of claim 1, further comprising:
a third gate structure wrapping around the third active region,
wherein the first gate structure is disposed directly on the first active region,
wherein the second gate structure is disposed directly on the second active region,
wherein the third gate structure is spaced apart from the third active region by a leftover dummy gate dielectric layer.

6. The semiconductor device of claim 1,
wherein a height of the first active region measured from a top surface of the substrate is substantially identical to a height of the second active region measured from the top surface of the substrate,
wherein the plurality of core devices operate at a first voltage,
wherein the first plurality of I/O transistors operate at a second voltage,
wherein the second plurality of I/O transistors operate at a third voltage,
wherein the second voltage is greater than the third voltage and the third voltage is greater than the first voltage.

7. The semiconductor device of claim 6,
wherein the first active region and the second active region extend continuously from the substrate,
wherein the first voltage is between about 0.5 V and about 0.9 V, the second voltage is between about 2.5 V and about 8 V, and the third voltage is between about 1.8 V and about 2.75 V.

8. The semiconductor device of claim 1,
wherein the substrate, the first active region and the second active region are formed of a semiconductor material,
wherein the first active region and the second active region extend continuously from the substrate.

9. The semiconductor device of claim 1, wherein the first direction extends parallel to a top surface of the substrate.

10. The semiconductor device of claim 1, wherein the second plurality of I/O transistors are disposed between the first plurality of I/O transistors and the plurality of core devices.

11. A semiconductor device, comprising:
a substrate;
a plurality of core devices over the substrate, each of the plurality of core devices including a first active region extending along a first direction;
a first plurality of input/output (I/O) transistors over the substrate, each of the first plurality of I/O transistors including a second active region extending along the first direction;
a second plurality of I/O transistors over the substrate, each of the second plurality of I/O transistors including a third active region extending along the first direction;
a first gate structure wrapping around the first active region and extending along a second direction perpendicular to the first direction; and
a second gate structure wrapping around the second active region and extending along the second direction,
where the first active region includes a first width along the second direction, the second active region includes a second width along the second direction, and the third active region includes a third width along the second direction,
wherein the first width is equal to the second width,
wherein the third width is greater than the first width.

12. The semiconductor device of claim 11, wherein the first plurality of I/O transistors are disposed between the plurality of core devices and the second plurality of I/O transistors.

13. The semiconductor device of claim 11, further comprising:
a third gate structure disposed over the third active region and extending along the second direction,
wherein the second gate structure is spaced apart from the second active region by a leftover dummy gate dielectric layer, wherein the first gate structure is in direct contact with the first active region, wherein the third gate structure is in direct contact with the third active region.

14. The semiconductor device of claim 13,
wherein the first active region, the second active region and the third active region are in direct contact with the substrate,
wherein the plurality of core devices operate at a first voltage,
wherein the first plurality of I/O transistors operate at a second voltage,
wherein the second plurality of I/O transistors operate at a third voltage,
wherein the third voltage is greater than the second voltage and the second voltage is greater than the first voltage.

15. The semiconductor device of claim 14,
wherein a height of the first active region measured from a top surface of the substrate is substantially identical to a height of the second active region measured from the top surface of the substrate,
wherein the first voltage is between about 0.5 V and about 0.9 V, the second voltage is between about 1.8 V and about 2.75 V, and the third voltage is between about 2.5 V and about 8V.

16. A semiconductor structure, comprising:
a semiconductor substrate including a first device region and a second device region;
a first plurality of transistors in the first device region, each of the first plurality of transistor including two semiconductor fins extending in parallel along a first direction and spaced apart from one another along a second direction perpendicular to the first direction;
a second plurality of transistors in the second device region, each of the second plurality of transistors including a semiconductor mesa extending lengthwise along the first direction;
a first gate structure wrapping around each of the two semiconductor fins and extending lengthwise along the second direction;
a second gate structure wrapping around the semiconductor mesa and extending lengthwise along the second direction;
a third plurality of transistors in a third device region disposed between the first device region and the second device region, each of the third plurality of transistors including a wide semiconductor fin extending along the first direction; and
a third gate structure wrapping around the wide semiconductor fin,
wherein the first gate structure and the second gate structure are aligned and spaced apart from one another along the second direction and have a same dimension along the first direction to give appearance that the first gate structure and the second structure are divided from a single gate structure,
wherein one of the first plurality of transistors is adjacent one of the second plurality of transistors,
where each of the two semiconductor fins includes a first width along the second direction and the semiconductor mesa includes a second width along the second direction,
wherein the second width is greater than the first width,
wherein the first gate structure is spaced apart from the semiconductor fin by a leftover dummy gate dielectric layer,
wherein the second gate structure is disposed directly on the semiconductor mesa,
wherein the two semiconductor fins and the semiconductor mesa rise continuously from the semiconductor substrate,
wherein the wide semiconductor fin comprises a third width along the second direction,
wherein the third width is greater than the first width and smaller than the second width.

17. The semiconductor structure of claim 16, wherein a ratio of the second width to the first width is between about 2 and about 600.

18. The semiconductor structure of claim 16,
wherein the first plurality of transistors operate at a first voltage,
wherein the second plurality of transistors operate at a second voltage,
wherein a ratio of the second voltage to the first voltage is between about 3 and about 10.

19. The semiconductor structure of claim 18,
wherein a height of the semiconductor fin measured from a top surface of the semiconductor substrate is substantially identical to a height of the semiconductor mesa measured from the top surface of the semiconductor substrate,
wherein the first voltage is about 0.8 V and the second voltage is between 2.5 V and about 8 V,
wherein the wide semiconductor fin comprises a third width along the second direction,
wherein the third width is greater than the first width and smaller than the second width.

20. The semiconductor structure of claim 16, wherein the first direction extends parallel to a top surface of the semiconductor substrate.

* * * * *